US012587763B2

(12) United States Patent
Lee

(10) Patent No.: US 12,587,763 B2
(45) Date of Patent: Mar. 24, 2026

(54) COMPARISON CIRCUIT AND IMAGE SENSING DEVICE INCLUDING THE SAME

(71) Applicant: SK hynix Inc., Icheon-si (KR)

(72) Inventor: Junghan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 18/482,598

(22) Filed: Oct. 6, 2023

(65) Prior Publication Data

US 2024/0340548 A1 Oct. 10, 2024

(30) Foreign Application Priority Data

Apr. 4, 2023 (KR) ........................ 10-2023-0043918

(51) Int. Cl.
H04N 25/709 (2023.01)
H02M 3/07 (2006.01)
H03K 5/24 (2006.01)
H04N 25/77 (2023.01)

(52) U.S. Cl.
CPC ............. H04N 25/709 (2023.01); H03K 5/24 (2013.01); H04N 25/77 (2023.01); H02M 3/07 (2013.01)

(58) Field of Classification Search
CPC .... H04N 25/709; H04N 25/77; H04N 25/745; H04N 25/75; H03K 5/24; H03K 5/2481; H03K 5/249; H02M 3/07
See application file for complete search history.

(56) References Cited

U.S. PATENT DOCUMENTS

| | | | |
|---|---|---|---|
| 5,793,230 A | 8/1998 | Chu et al. | |
| 2016/0233770 A1* | 8/2016 | Arakawa | H02M 3/158 |
| 2020/0145599 A1* | 5/2020 | Matsuzaki | H10F 39/12 |
| 2020/0322557 A1* | 10/2020 | Shim | H04N 25/7795 |

FOREIGN PATENT DOCUMENTS

KR 1020220084487 A 6/2022

* cited by examiner

*Primary Examiner* — Albert H Cutler
(74) *Attorney, Agent, or Firm* — WILLIAM PARK AND ASSOCIATES LTD.

(57) ABSTRACT

A comparison circuit and an image sensing device including the same are disclosed. The comparison circuit includes a comparison block configured to include a comparator that compares signals of input nodes with each other within a first period and outputs a signal corresponding to a result of the comparison to an output node and configured to initialize the comparator by allowing a voltage of the output node to be fed back to an input terminal of the comparator within a second period, and a stabilization circuit configured to supply a first voltage to the output node within the second period. In the second period, the stabilization circuit is connected to the output node to supply the first voltage. In the first period, connection between the stabilization circuit and the output node is cut off.

18 Claims, 6 Drawing Sheets

COMPARISON CIRCUIT AND IMAGE SENSING DEVICE INCLUDING THE SAME

CROSS-REFERENCE TO RELATED APPLICATION

This patent document claims the priority under 35 U.S.C. § 119 (a) to, and benefits of, Korean patent application No. 10-2023-0043918, filed on Apr. 4, 2023, in the Korean Intellectual Property Office, which is hereby incorporated by reference in its entirety as part of the disclosure of this patent document.

TECHNICAL FIELD

The technology and implementations disclosed in this patent document generally relate to a comparison circuit and an image sensing device including the same.

BACKGROUND

An ideal comparator is a circuit in which an output voltage is zero volts (0V) when an input voltage is zero volts (0V). In practice, the output voltage of the ideal comparator might not be zero volts (0V) due to mismatches, offsets, etc. between circuit components. However, auto-zero technology may be used to offset (or cancel) these offsets. When using the auto-zero technology, the operation speed of the comparator may be reduced if various circuit components are added to the comparator in order to secure stability of the comparator. When an offset occurs in the comparator or the operation speed of the comparator becomes slower, a voltage to be supplied to internal circuits of the comparator may change such that unexpected malfunctions may occur. Accordingly, it is important to implement a comparator capable of operating at a high speed while securing the stability thereof.

SUMMARY

In accordance with an embodiment of the disclosed technology, a comparison circuit may include a comparison block configured to include a comparator that compares signals of input nodes with each other within a first period and outputs a signal corresponding to a result of the comparison to an output node and configured to initialize the comparator by allowing a voltage of the output node to be fed back to an input terminal of the comparator within a second period; and a stabilization circuit configured to supply a first voltage to the output node within the second period, wherein, in the second period, the stabilization circuit is connected to the output node to supply the first voltage; and wherein, in the first period, connection between the stabilization circuit and the output node is cut off.

In accordance with another embodiment of the disclosed technology, a comparison circuit may include a comparator configured to compare signals of input nodes with each other, and configured to output a signal corresponding to a result of the comparison to an output node; a first switching element connected to the input node; a first capacitor connected between the first switching element and the comparator; a second switching element connected between one terminal of the first capacitor and a ground voltage terminal; a third switching element connected between an input terminal and an output terminal of the comparator; a fourth switching element having one terminal connected to the output node; a resistor connected to another terminal of the fourth switching element; a second capacitor connected between the resistor and a ground voltage terminal; and a fifth switching element connected between a ground voltage terminal and a connection node disposed between the fourth switching element and the resistor.

In accordance with another embodiment of the disclosed technology, an image sensing device may include a voltage generator configured to generate an operation voltage by pumping an input voltage; a row driver configured to generate a drive voltage based on the operation voltage; and a pixel array configured to generate a pixel signal by controlling a pixel circuit in response to the drive voltage, wherein the voltage generator includes a comparison circuit that compares signals of input nodes with each other and outputs a signal corresponding to a result of the comparison to an output node, wherein the comparison circuit includes a stabilization circuit configured to supply a first voltage to the output node by connecting to the output node within a first period and configured to block a connection to the output node within a second period.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
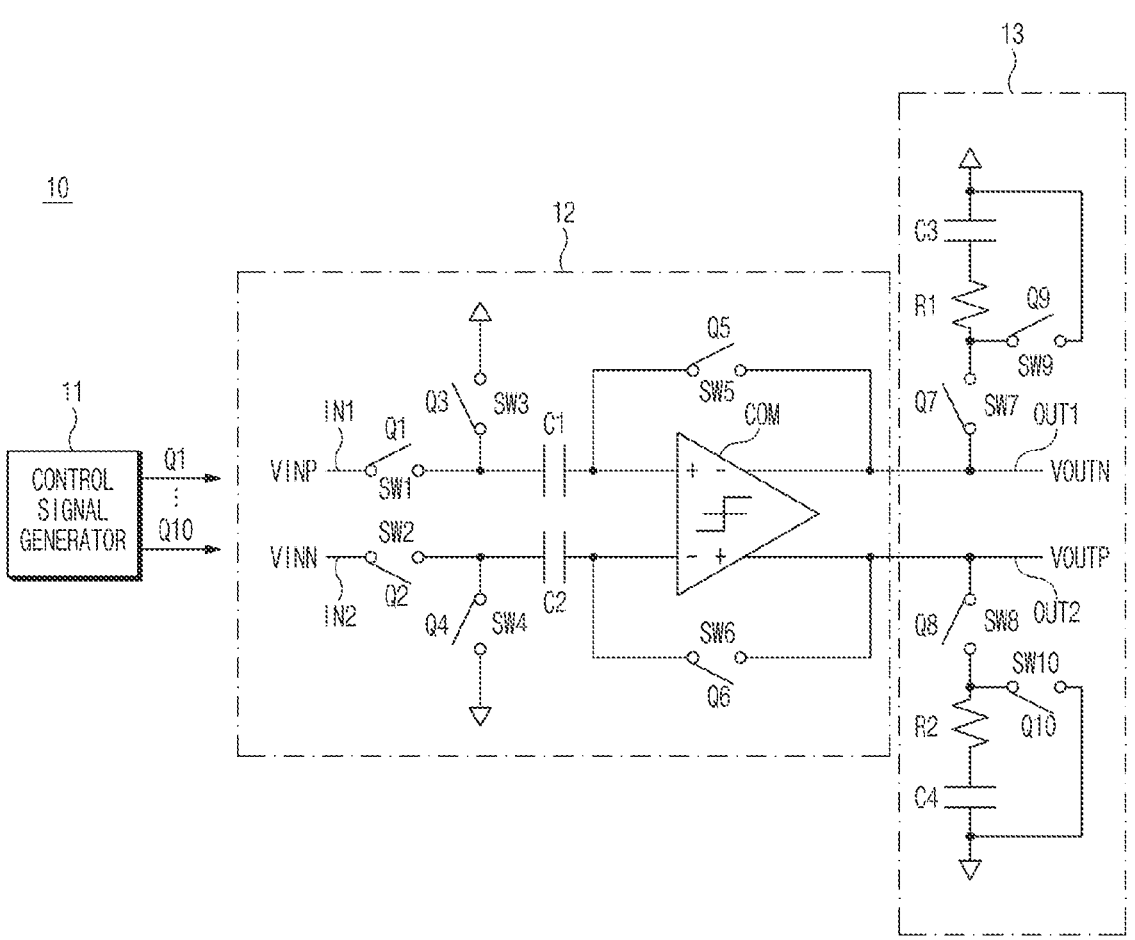
FIG. 1 is a circuit diagram illustrating an example of a comparison circuit based on some implementations of the disclosed technology.

This patent document provides implementations and examples of a comparator and an image sensing device including the same that may be used in configurations to substantially address one or more technical or engineering issues and to mitigate limitations or disadvantages encountered in other comparators and image sensing devices. Some implementations of the disclosed technology relate to a comparison circuit capable of operating at a high speed while securing the operation stability, and an image sensing device including the same. In recognition of the issues above, the comparison circuit and the image sensing device including the same based on some implementations of the disclosed technology can operate at a high speed while securing operation stability.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Various embodiments of the disclosed technology relate to a comparison circuit capable of operating at a high speed while securing operation stability, and an image sensing device including the same.

FIG. 1 is a circuit diagram illustrating an example of a comparison circuit based on some implementations of the disclosed technology.

Referring to FIG. 1, the comparison circuit 10 may include a control signal generator 11, a comparison block 12, and a stabilization circuit 13.

The control signal generator 11 may generate control signals Q1 to Q10 that control switching operations of a plurality of switching elements (to be described later) in the comparison block 12 and the stabilization circuit 13. For example, the control signal generator 11 may activate the control signals Q3 to Q8 in order to perform an auto-zeroing operation within an auto-zero period, which will be described later. Also, the control signal generator 11 may activate the control signals Q1, Q2, Q9, and Q10 in order to perform a comparison operation within a comparison operation period, which will be described later. Here, the control signals Q3 to Q8 may be signals having the same phase. The control signals Q1, Q2, Q9, and Q10 may be signals having the same phase. In addition, the control signals Q3 to Q8 and the control signals Q1, Q2, Q9, and Q10 may be signals having opposite phases.

The comparison block 12 may compare input signals VINP and VINN with each other and may generate output signals VOUTN and VOUTP corresponding to the result of the comparison. The comparison block 12 may be controlled by control signals Q1 to Q6 from among the control signals Q1 to Q10 received from the control signal generator 11.

The comparison block 12 may offset (or cancel) offset voltages of output nodes OUT1 and OUT2 through an auto-zeroing operation. For example, the comparison block 12 may perform the auto-zeroing operation when the control signals Q3 to Q6 are activated in the auto-zero period. Also, the comparison block 12 may perform the comparison operation when the control signals Q1 and Q2 are activated in the comparison operation period.

Here, the auto-zero period may refer to a time period in which an input terminal of the comparator COM is connected to the output nodes OUT1 and OUT2 during a high-speed operation so that the operation of the comparator COM is initialized before the comparison block 12 performs the comparison operation, resulting in the cancellation of the offset.

The comparison block 12 may include a plurality of switching elements SW1 to SW6, a plurality of capacitors C1 and C2, and a comparator COM.

The switching element SW1 may be connected between an input node IN1 and a capacitor C1 so that the switching operation thereof can be controlled by the control signal Q1. The switching element SW2 may be connected between an input node IN2 and a capacitor C2 so that the switching operation thereof can be controlled by the control signal Q2. The switching element SW3 may be connected between one terminal of the capacitor C1 and a ground voltage terminal such that the switching operation thereof can be controlled by the control signal Q3. The switching element SW4 may be connected between one terminal of the capacitor C2 and a ground voltage terminal such that the switching operation thereof can be controlled by the control signal Q4. The capacitor C1 may be connected between the switching element SW1 and one terminal of the comparator COM. Also, the capacitor C2 may be connected between the switching element SW2 and the other terminal of the comparator COM.

The comparator COM may include an operational amplifier OP-AMP having a 2-input/2-output structure. For example, the comparator COM may have a non-inverting (+) input terminal for receiving the input signal VINP, an inverting (−) input terminal for receiving the input signal VINN, and an inverting (−) output terminal for outputting the output signal VOUTN, and a non-inverting (+) output terminal for outputting the output signal VOUTP.

The comparator COM may be connected between the capacitors C1 and C2 and the output nodes OUT1 and OUT2. The switching element SW5 may be connected between the input terminal of the comparator COM and the output node OUT1. The switching element SW6 may be connected between the input terminal of the comparator COM and the output node OUT2.

In addition, the stabilization circuit 13 may secure the operation stability by supplying a stabilization voltage to the output nodes OUT1 and OUT2 during the auto-zeroing operation of the comparator COM within the auto-zero period. On the other hand, the stabilization circuit 13 may prevent the stabilization voltage from being supplied to the output nodes OUT1 and OUT2 of the comparator COM at the end of the auto zero period, thereby enabling a high-speed operation.

The stabilization circuit 13 may include a plurality of switching elements SW7 to SW10, a plurality of capacitors C3 and C4, and a plurality of resistors R1 and R2.

The switching element SW7 may be connected between the output node OUT1 and the resistor R1 so that the switching operation thereof can be controlled by the control signal Q7. The resistor R1 may be connected between the switching element SW7 and the capacitor C3. The switching element SW9 may be connected between one terminal of the resistor R1 and one terminal of the capacitor C3 so that the switching operation thereof can be controlled by the control signal Q9. The capacitor C3 may be connected between the other terminal of the resistor R1 and the ground voltage terminal.

The switching element SW8 may be connected between the output node OUT2 and the resistor R2 so that the switching operation thereof can be controlled by the control signal Q8. The resistor R2 may be connected between the switching element SW8 and the capacitor C4. The switching element SW10 may be connected between one terminal of the resistor R2 and one terminal of the capacitor C4 so that the switching operation thereof can be controlled by the control signal Q10. The capacitor C4 may be connected between the other terminal of resistor R2 and the ground voltage terminal.

The operation of the comparison circuit 10 having the above-described constituent elements will be described in detail with reference to FIGS. 2 to 4 to be described later.

Figure 2:
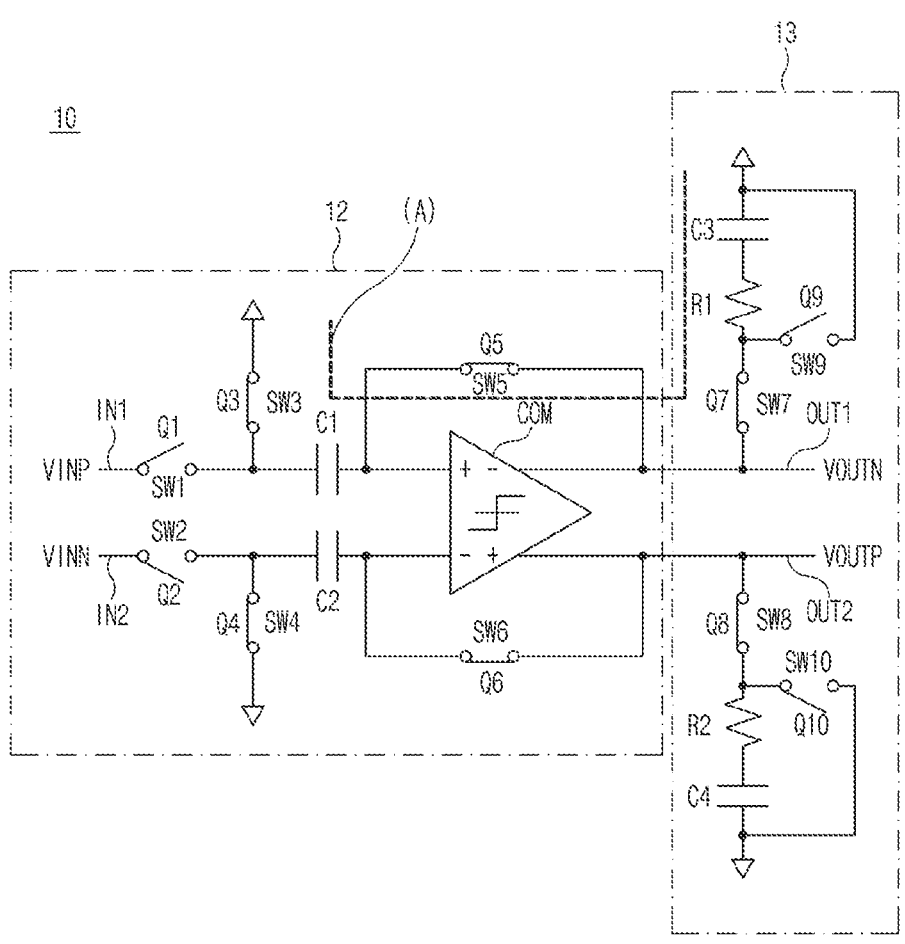
FIGS. 2 and 3 are circuit diagrams illustrating example operations of the comparison circuit shown in FIG. 1 based on some implementations of the disclosed technology.
Figure 3:
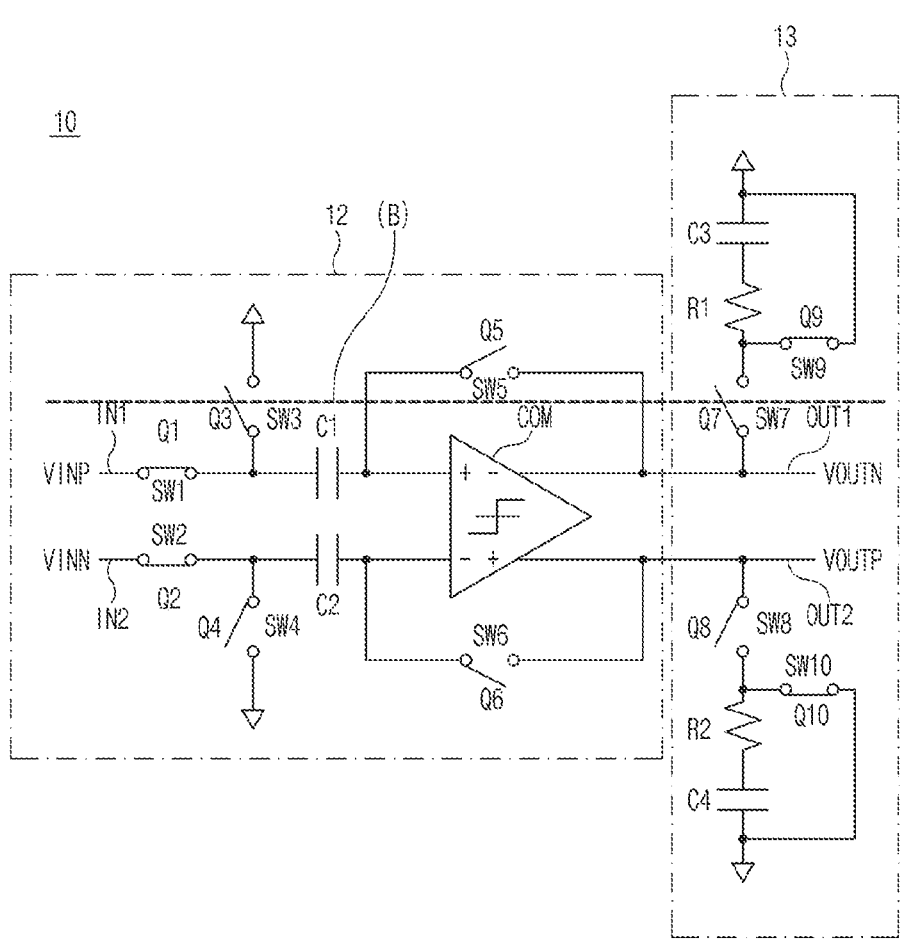
Figure 4:
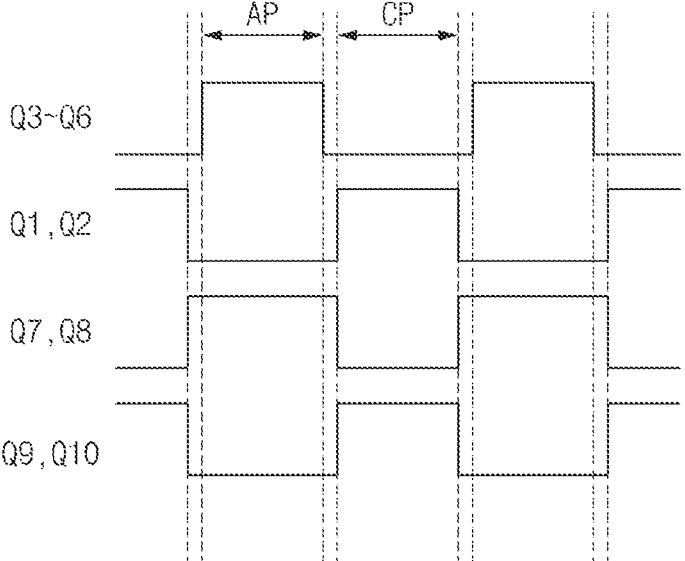
FIG. 4 is a timing diagram illustrating example operations of the comparison circuits shown in FIGS. 2 and 3 based on some implementations of the disclosed technology.

FIGS. 2 and 3 are circuit diagrams illustrating example operations of the comparison circuit 10, shown in FIG. 1, based on some implementations of the disclosed technology. FIG. 4 is a timing diagram illustrating example operations of the comparison circuits 10, shown in FIGS. 2 and 3, based on some implementations of the disclosed technology.

FIG. 2 is a circuit diagram illustrating an example of the operation of the comparison circuit 10 when a closed loop is formed, shown as (A), within the auto-zero period AP. FIG. 3 is a circuit diagram illustrating an example of the operation of the comparison circuit 10 when an open loop is formed, shown in (B), within the comparison operation period CP after lapse of the auto-zero period AP.

An operation process of the comparison circuit 10 of FIGS. 2 and 3 will be described with reference to the operation timing diagram of FIG. 4 as follows. In the operation timing diagram of FIG. 4, a period in which the control signals Q1 to Q10 are shown at high levels means a period for controlling the corresponding switching elements SW1 to SW10 to be turned on (i.e., connected), and another period in which the control signals Q1 to Q10 are shown at low levels means a period for controlling the corresponding switching elements SW1 to SW10 to be turned off (i.e., short-circuited).

First, referring to FIG. 2, in the auto-zero period AP, the switching elements SW1 and SW2 of the comparison block 12 may be turned off (i.e., short-circuited) by the control signals Q1 and Q2, and the switching elements SW3 to SW6 may be turned on (connected) by the control signals Q3 to Q6. That is, the switching elements SW1 and SW2 and the switching elements SW3 to SW6 may operate in an inverse manner.

Then, the input terminal of the comparator COM and the output nodes OUT1 and OUT2 of the comparator COM may be electrically connected through the switching elements SW5 and SW6. Accordingly, the voltages of the output nodes OUT1 and OUT2 of the comparator COM may be fed back to the input terminal of the comparator COM, thereby performing the auto-zeroing operation to remove the offset. In addition, a ground voltage (i.e., an initialization voltage) may be provided to the capacitors C1 and C2 through the switching elements SW3 and SW4 so as to initialize the input terminal of the comparator COM by the capacitors C1 and C2.

In the auto-zero period AP, the switching elements SW7 and SW8 of the stabilization circuit 13 may be turned on by the control signals Q7 and Q8, and the switching elements SW9 and SW10 may be turned off by the control signals Q9 and Q10. That is, the switching elements SW7 and SW8 and the switching elements SW9 and SW10 may operate in an inverse manner.

Then, the resistor R1 may be connected to the output node OUT1 through the switching element SW7 so that the voltage of the output node OUT1 can be controlled based on the values of the resistor R1 and the capacitor C3. In addition, the resistor R2 may be connected to the output node OUT2 through the switching element SW8 so that the voltage of the output node OUT2 can be controlled based on the values of the resistor R2 and the capacitor C4. Here, the voltage to be provided to the output node OUT1 based on a resistance value of the resistor R1 and a capacitance value of the capacitor C3 or the voltage to be provided to the output node OUT2 based on a resistance value of the resistor R2 and a capacitance value of the capacitor C4 may hereinafter be referred to as a "stabilization voltage (i.e., a first voltage)" by a resistor-capacitor (RC) network. That is, the RC network of the stabilization circuit 13 may provide a stabilization voltage to the output nodes OUT1 and OUT2 by increasing a resistor-capacitor (RC) time constant at the output stage of the comparator COM.

On the other hand, referring to FIG. 3, in the comparison operation period CP, the switching elements SW1 and SW2 of the comparison block 12 may be turned on by the control signals Q1 and Q2, and the switching elements SW3 to SW6 may be turned off by the control signals Q3 to Q6. Then, the input nodes IN1 and IN2 and the input terminals of the capacitors C1 and C2 may be electrically connected through the switching elements SW1 and SW2. Accordingly, the input signals VINP and VINN may be transferred to the input terminal of the comparator COM through the capacitors C1 and C2 so that the comparison operation can be performed.

In the comparison operation period CP, the switching elements SW7 and SW8 of the stabilization circuit 13 may be turned off by the control signals Q7 and Q8, and the switching elements SW9 and SW10 may be turned on by the control signals Q9 and Q10. When the switching elements SW7 and SW8 are turned off, connection between the output node OUT1 and the resistor R1 and connection between the output node OUT2 and the resistor R2 may be electrically cut off (i.e., blocked). At this time, since the switching elements SW9 and SW10 are turned on, the resistors R1 and R2 and the capacitors C3 and C4 might not act as loads so that the operation of the comparison circuit 10 is not affected.

As described above, in order to remove the offset from the auto-zero period AP, the operation stability of the comparator COM must be secured while the closed loop is formed. To this end, in some implementations of the disclosed technology, the RC network (including the resistor R1 and the capacitor C3) for using the dominant pole compensation technique may be connected to the output node OUT1 of the comparator COM, and the RC network (including the resistor R2 and the capacitor C4) for using the dominant pole compensation technique may be connected to the output node OUT2 of the comparator COM. Here, the dominant pole compensation technique may also be referred to as an external frequency compensation technique. That is, in some implementations of the disclosed technology, when a closed loop is formed as shown in (A) within the auto-zero period AP, the operation stability of the comparator COM can be secured by allowing the output poles of the output nodes OUT1 and OUT2 to serve as dominant poles by the RC network.

The embodiment of the disclosed technology has disclosed that the RC network of the stabilization circuit 13 secures the operation stability in the auto-zero period AP of the comparator COM according to the dominant pole compensation technique. However, the scope or spirit of the embodiment of the disclosed technology is not limited thereto, and the operation stability by the RC network can be secured according to various technologies. As another example, the stabilization circuit 13 may secure the operation stability through a zero-nulling technology.

Zero-nulling technology is a technique that secures a phase margin while having a wide gain bandwidth according to the Miller effect of the resistors R1 and R2 and the capacitors C3 and C4. Here, the Miller effect may refer to the effect in which the capacitance at the output terminal of the comparator COM is amplified by the Miller resistance of the resistors R1 and R2 and the Miller capacitance of the capacitors C3 and C4.

As described above, according to the embodiment of the disclosed technology, when the switching elements (SW7, SW8) are turned on within the auto-zero period AP, a closed loop path may be formed and the RC network may be connected to the output nodes OUT1 and OUT2, thereby securing the operation stability of the comparator COM.

However, when the RC network is connected to the output nodes OUT1 and OUT2, the operation of the comparator COM may become slower. In this case, since the comparison circuit 10 reacts slowly, an unexpected operation error may occur in a feedback system that operates by receiving the output voltage of the comparison circuit 10 as an input. Accordingly, according to the embodiment of the disclosed technology, when the switching elements SW9 and SW10 are turned on within the comparison operation period CP, an open loop path may be formed and the RC network may be blocked from the output nodes OUT1 and OUT2 so that the high-speed operation of the comparison circuit 10 might not be affected.

Figure 5:
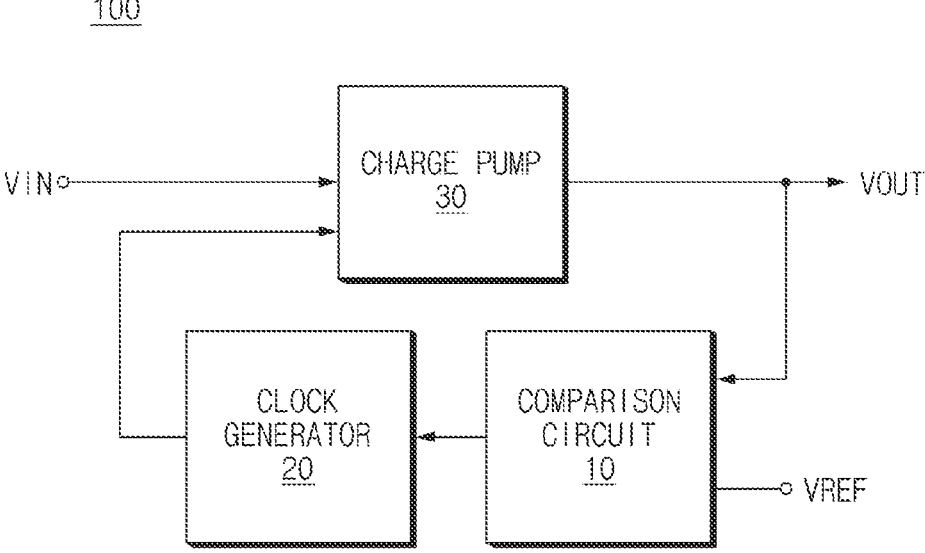
FIG. 5 is a block diagram illustrating an example of a pumping circuit including the comparison circuit shown in FIG. 1 based on some implementations of the disclosed technology.

FIG. 5 is a block diagram illustrating an example of a pumping circuit including the comparison circuit shown in FIG. 1 based on some implementations of the disclosed technology.

Referring to FIG. 5, the pumping circuit 100 may generate an operation voltage VOUT by pumping an input voltage VIN. The pumping circuit 100 may include a comparison circuit 10, a clock generator 20, and a charge pump 30.

Here, the comparison circuit 10 may compare a preset reference voltage VREF with a feedback-input operation voltage VOUT and may output a comparison signal (e.g., a clock enable signal) obtained according to the comparison result to the clock generator 20.

The comparison circuit 10 of FIG. 5 may correspond to the comparison circuit 10, shown in FIG. 1, described above, and as such a detailed description of the comparison circuit 10 will herein be omitted. For example, the reference voltage VREF and the operation voltage VOUT, each of which is input to the comparison circuit 10, may correspond to voltages to be applied to the input nodes IN1 and IN2 of FIG. 1. Also, the output line of the comparison circuit 10 may be any one of the output lines OUT1 and OUT2 of FIG. 1. In the embodiment of FIG. 5, the output line of the comparison circuit 10 may correspond to the output line OUT1 of FIG. 1.

The clock generator 20 may generate a clock signal based on the output signal (i.e., a clock enable signal) of the comparison circuit 10. The charge pump 30 may generate the operation voltage VOUT through a charge pumping of the input voltage VIN in response to the clock signal received from the clock generator 20. For example, the charge pump 30 may control the amount of output charges, an output speed, etc. according to a clock cycle or a duty cycle. In some implementations, the charge pump 30 may include an N-stage charge pump in which the charge pump is configured in multiple stages. In some other implementations, the charge pump 30 may include a DCDC charge pump.

Figure 6:
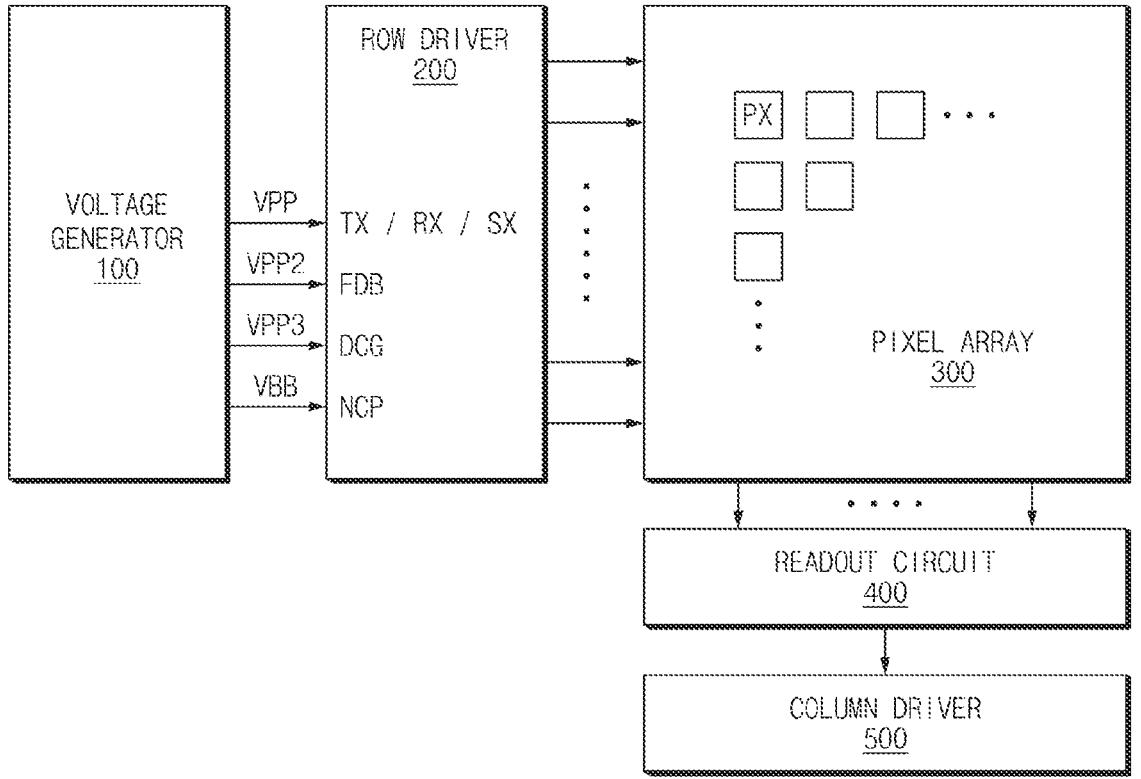
FIG. 6 is a schematic diagram illustrating an example of an image sensing device including a comparison circuit based on some other implementations of the disclosed technology.

FIG. 6 is a schematic diagram illustrating an example of an image sensing device including a comparison circuit based on some other implementations of the disclosed technology.

Referring to FIG. 6, the image sensing device, based on some implementations of the disclosed technology, may include a voltage generator 100, a row driver 200, a pixel array 300, a readout circuit 400, and a column driver 500.

The voltage generator 100 may generate a voltage and may provide the generated voltage to the row driver 200. For example, the voltage generator 100 may generate pumping voltages VPP, VPP2, and VPP3 and a back-bias voltage VBB. The pumping voltages VPP, VPP2, and VPP3 may have a higher voltage level than the reference voltage (e.g., a power-supply voltage), and the back-bias voltage VBB may having a lower level than the reference voltage (e.g., the ground voltage).

Here, the pumping voltage VPP may be a voltage for controlling a transfer control signal TX, a reset control signal RX, or a selection control signal SX. Also, the pumping voltage VPP2 may be a boosting voltage FDB for increasing a voltage level of a floating diffusion region. Also, the pumping voltage VPP3 may be a dual conversion gain DCG control voltage that selectively provides additional capacitance to the floating diffusion region. Also, the back-bias voltage VBB may be a negative charge pump NCP to be provided to a transfer transistor to prevent a generation of dark current.

As described above, the voltage generated by the voltage generator 100 may affect the operation of the pixel array 300. Accordingly, in order to stably control the voltage to be generated by the voltage generator 100, a comparison circuit 10 capable of performing high-speed operation without having an offset is essential. Accordingly, the voltage generator 100 may use the pumping circuit 100 including the comparison circuit 10, shown in FIGS. 1 to 3. A voltage required by the row driver 200 can be accurately generated through the voltage generator 100.

In the embodiment of FIG. 6, the voltage generator 100 may correspond to the pumping circuit 100, described in FIG. 5. In the embodiment of FIG. 6, the voltages VPP, VPP2, VPP3, and VBB, each of which is output from the voltage generator 100, may correspond to the output voltage VOUT of FIG. 5.

The pumping circuit 100 including the comparison circuit 10, shown in FIGS. 1 to 3, may be applied to the voltage generator 100 of the image sensing device, shown in FIG. 6, so that the voltage supplied to the row driver 200 can be stably controlled, and at the same time, the high-speed operation can be performed.

The row driver 200 may drive the pixel array 300 in units of a row line. For example, the row driver 120 may generate a transfer control signal TX that controls a transfer transistor of a pixel circuit, a reset control signal RX for controlling a reset transistor, or a selection control signal SX for controlling a selection transistor.

The pixel array 300 may generate a pixel signal in response to a control signal generated from the row driver 200. The pixel array 300 may include a plurality of pixels PX arranged in an array shape along a plurality of row lines and a plurality of column lines. Each of the plurality of pixels PXs may include a photoelectric conversion element configured to generate charges in response to incident light, for example, a photodiode, phototransistor, a pinned photodiode, etc. Each of the plurality of pixels PXs may include a pixel circuit that generates a pixel signal. The pixel circuit may include a transfer transistor, a drive (source-follower) transistor, a selection transistor, and a reset transistor.

The readout circuit 400 may convert the pixel signal generated from the pixel array 300 into a digital signal and thus may output the digital signal. The readout circuit 400 may include a sampling circuit and an analog-to-digital converter (ADC).

The column driver 500 may include a latch or buffer capable of temporarily storing the digital signal. The column driver 500 may output image data by processing the digital signal received from the readout circuit 400.

As is apparent from the above description, the comparison circuit and the image sensing device including the same based on some implementations of the disclosed technology can operate at a high speed while securing operation stability.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. A comparison circuit comprising:
a comparison block configured to include a comparator that compares signals of input nodes with each other within a comparison operation period and outputs a signal corresponding to a result of the comparison to an output node and configured to initialize the comparator by allowing a voltage of the output node to be fed back to an input terminal of the comparator within auto zero period; and
a stabilization circuit configured to supply a first voltage to the output node within the auto zero period,
wherein, in the auto zero period, the stabilization circuit is connected to the output node to supply the first voltage; and
wherein, in the comparison operation period, connection between the stabilization circuit and the output node is cut off,
wherein the stabilization circuit includes:
a first switching element having one terminal connected to the output node;
a resistor connected to another terminal of the first switching element;
a first capacitor connected between the resistor and a ground voltage terminal; and
a second switching element connected between the ground voltage terminal and a connection node disposed between the first switching element and the resistor.

2. The comparison circuit according to claim 1,
wherein, in the auto zero period, a first loop is formed such that, in a state in which connection between the input nodes and the comparator is cut off and the input terminal of the comparator is connected to an output terminal of the comparator, an initialization voltage is supplied to the input terminal of the comparator and the first voltage is supplied to the output node.

3. The comparison circuit according to claim 1,
wherein, in the comparison operation period, a second loop is formed such that, in a state in which the input nodes is connected to the comparator and connection between the input terminal of the comparator and an output terminal of the comparator is cut off, the connection between the stabilization circuit and the output node is cut off.

4. The comparison circuit according to claim 1, wherein the comparison block includes:
a third switching element connected to the input nodes;

a second capacitor connected between the third switching element and the comparator;
a fourth switching element connected between one terminal of the second capacitor and the ground voltage terminal; and
a fifth switching element connected between an input terminal and an output terminal of the comparator.

5. The comparison circuit according to claim 4, wherein:
the third switching element is configured to operate inversely with the fourth switching element and the fifth switching element.

6. The comparison circuit according to claim 4,
wherein, in the auto zero period, the third switching element is turned off and the fourth switching element and the fifth switching element are turned on such that the comparator is initialized;
wherein, in the comparison operation period, the third switching element is turned on and the fourth switching element and the fifth switching element are turned off such that a comparison operation of the comparator is performed.

7. The comparison circuit according to claim 1, wherein:
the first switching element and the second switching element are configured to operate in an inverse manner.

8. The comparison circuit according to claim 1,
wherein, in the auto zero period, the first switching element is turned on and the second switching element is turned off such that the first voltage is supplied to the comparator; and
wherein, in the comparison operation period, the first switching element is turned off and the second switching element is turned on such that a comparison operation of the comparator is performed.

9. The comparison circuit according to claim 1, wherein:
the first voltage is a resistor-capacitor (RC) network voltage that is provided to the output node based on a resistance value of the resistor and a capacitance value of the first capacitor.

10. A comparison circuit comprising:
a comparator configured to compare signals of input nodes with each other and configured to output a signal corresponding to a result of the comparison to an output node;
a first switching element connected to an input node of the input nodes;
a first capacitor connected between the first switching element and the comparator;
a second switching element connected between one terminal of the first capacitor and a ground voltage terminal;
a third switching element connected between an input terminal and an output terminal of the comparator;
a fourth switching element having one terminal connected to the output node;
a resistor connected to another terminal of the fourth switching element;
a second capacitor connected between the resistor and the ground voltage terminal; and
a fifth switching element connected between the ground voltage terminal and a connection node disposed between the fourth switching element and the resistor.

11. The comparison circuit according to claim 10, wherein:
in a first period, the first switching element and the fifth switching element are turned off, and the second switching element, the third switching element, and the fourth switching element are turned on such that an offset cancellation operation of the comparator is performed.

12. The comparison circuit according to claim 10, wherein:

in a second period, the first switching element and the fifth switching element are turned on, and the second switching element, the third switching element, and the fourth switching element are turned off such that a comparison operation of the comparator is performed.

13. The comparison circuit according to claim 10, wherein:

the first switching element and the fifth switching element are configured to operate inversely with the second switching element, the third switching element, and the fourth switching element.

14. An image sensing device comprising:

a voltage generator configured to generate an operation voltage by pumping an input voltage;

a row driver configured to generate a drive voltage based on the operation voltage; and a pixel array configured to generate a pixel signal by controlling a pixel circuit in response to the drive voltage, wherein the voltage generator includes a comparison circuit that compares signals of input nodes with each other and outputs a signal corresponding to a result of the comparison to an output node, wherein the comparison circuit includes a stabilization circuit configured to supply a first voltage to the output node by connecting to the output node within an auto zero period and configured to block a connection to the output node within a comparison operation period, wherein the stabilization circuit includes:

a first switching element having one terminal connected to the output node;

a resistor connected to another terminal of the first switching element;

a capacitor connected between the resistor and a ground voltage terminal; and a second switching element connected between the ground voltage terminal and a connection node disposed between the first switching element and the resistor.

15. The image sensing device according to claim 14, wherein the voltage generator includes:

a clock generator configured to generate a clock signal in response to an output signal of the comparison circuit; and a charge pump configured to generate the operation voltage by pumping the input voltage based on the clock signal.

16. The image sensing device according to claim 14, wherein the operation voltage is at least one of:

a voltage configured to control a transfer control signal, a reset control signal, and a selection control signal of the pixel circuit;

a boosting voltage configured to increase a voltage level of a floating diffusion region of the pixel circuit;

a dual conversion gain (DCG) control voltage configured to provide additional capacitance to the floating diffusion region of the pixel circuit; and a negative voltage provided to a transfer transistor of the pixel circuit.

17. The image sensing device according to claim 14, wherein the comparison circuit includes:

a comparator configured to compare the signals of the input nodes with each other and output the signal corresponding to a result of the comparison to the output node, wherein, in the auto zero period, a first loop is formed such that, in a state in which connection between the input nodes and the comparator is cut off and an input terminal of the comparator is connected to an output terminal of the comparator, an initialization voltage is supplied to the input terminal of the comparator and the first voltage is supplied to the output node; and wherein, in the comparison operation period, a second loop is formed such that, in a state in which the input nodes are connected to the comparator and connection between the input terminal of the comparator and the output terminal of the comparator is cut off, connection between the stabilization circuit and the output node is cut off.

18. The image sensing device according to claim 14, wherein:

the first voltage is a resistor-capacitor (RC) network voltage that is provided to the output node based on a resistance value of the resistor and a capacitance value of the capacitor.

* * * * *